United States Patent
Sadowski

(10) Patent No.: US 9,577,618 B2
(45) Date of Patent: Feb. 21, 2017

(54) REDUCING POWER NEEDED TO SEND SIGNALS OVER WIRES

(71) Applicant: Advanced Micro Devices, Inc., Sunnyvale, CA (US)

(72) Inventor: Greg Sadowski, Cambridge, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 759 days.

(21) Appl. No.: 13/721,944

(22) Filed: Dec. 20, 2012

(65) Prior Publication Data

US 2014/0176195 A1    Jun. 26, 2014

(51) Int. Cl.
*H04B 3/50* (2006.01)
*H03K 5/00* (2006.01)

(52) U.S. Cl.
CPC . *H03K 5/00* (2013.01); *H04B 3/50* (2013.01)

(58) Field of Classification Search
CPC ............... G06F 1/00; G06F 1/04; G06F 1/12; G06F 1/26; G06F 1/32; G06F 11/30; G06F 15/16
See application file for complete search history.

(56) References Cited

U.S. PATENT DOCUMENTS

| | | | |
|---|---|---|---|
| 4,499,586 A * | 2/1985 | Cafarella et al. | 375/345 |
| 5,751,362 A * | 5/1998 | Lee | H04N 19/54 348/699 |
| 7,102,544 B1 * | 9/2006 | Liu | 341/51 |
| 9,189,051 B2 * | 11/2015 | Muff | G06F 1/3203 |
| 2002/0019896 A1 * | 2/2002 | Fornaciari | G06F 1/3253 710/100 |
| 2002/0051498 A1 * | 5/2002 | Thomas et al. | 375/262 |
| 2002/0087936 A1 * | 7/2002 | Self | G06F 13/4204 714/800 |
| 2003/0184549 A1 * | 10/2003 | Kim | G06F 3/1415 345/503 |
| 2009/0048852 A1 * | 2/2009 | Burns et al. | 704/503 |
| 2009/0310657 A1 * | 12/2009 | Allen | 375/219 |
| 2010/0259510 A1 * | 10/2010 | Lee | 345/204 |
| 2012/0029924 A1 * | 2/2012 | Duni | G10L 19/038 704/500 |
| 2012/0219067 A1 * | 8/2012 | Jefremov et al. | 375/240.24 |
| 2013/0016775 A1 * | 1/2013 | Varodayan et al. | 375/240.05 |
| 2014/0044166 A1 * | 2/2014 | Xu et al. | 375/240.12 |
| 2014/0098877 A1 * | 4/2014 | Xu et al. | 375/240.16 |

* cited by examiner

Primary Examiner — Thomas Lee
Assistant Examiner — Mohammad A Rahman
(74) Attorney, Agent, or Firm — Volpe and Koenig, P.C.

(57) ABSTRACT

Apparatus, computer readable medium, circuits, and method of reducing power in sending signals over two or more wires are disclosed. The method includes receiving two or more signals at a first end of the two or more wires. The method includes determining that the two or more signals should be encoded based at least on a previously received two or more signals. The method includes encoding the two or more signals. Additionally, the method includes sending the encoded two or more signals over the two or more wires. The method may include receiving the sent two or more signals at a second end of the two or more wires, and if the sent two or more signals were encoded, then decoding the two or more signals back to the values of the received two or more signals.

19 Claims, 10 Drawing Sheets

602

| Line Pattern | # of recharging | | Power |
| --- | --- | --- | --- |
| | Cs | Cp | |
| 1 yellow | 0 | 0 | 0 |
| 2 green | 1 | 1 | 2 |
| 3 blue | 2 | 0 | 2 |
| 4 red | 2 | 2 | 4 |

| Code | Could be replaced with |
| --- | --- |
| 0 | 1,4,5 |
| 1 | 0,4,5 |
| 2 | 3,6,7 |
| 3 | 2,6,7 |
| 4 | 0,1,5 |
| 5 | 0,1,4 |
| 6 | 2,3,7 |
| 7 | 2,3,6 |
| 8 | 9,12,13 |
| 9 | 8,12,13 |
| 10 | 11,14,15 |
| 11 | 9,14,15 |
| 12 | 8,9,13 |
| 13 | 8,9,12 |
| 14 | 10,11,15 |
| 15 | 10,11,14 |

REDUCING POWER NEEDED TO SEND SIGNALS OVER WIRES

TECHNICAL FIELD

The disclosed embodiments are generally directed to reducing power needed to send signals over wires, and in particular to reducing the power needed to send signals over wires where two or more wires are relatively close together.

BACKGROUND

Signals are sent across wires in many applications to interconnect one or more electronic circuits. For example, signals are sent across wires in integrated circuits and printed circuit boards. Often, it is important to reduce the amount of power needed to send the signals across the wires, and it may be important to decrease the amount of time it takes to switch to different signals on the wires. The wires used to send the signals may be relatively close to one another and the wires may be relatively long.

Therefore, there is a need in the art for an apparatus, circuit, computer readable medium, and method of reducing power needed to send signals over wires.

SUMMARY OF EMBODIMENTS

Some embodiments provide a method of reducing power in sending signals over two or more wires. The method includes receiving two or more signals at a first end of the two or more wires. The method includes determining that the two or more signals should be encoded based at least on a previously received two or more signals. The method includes encoding the two or more signals. Additionally, the method includes sending the encoded two or more signals over the two or more wires.

Some embodiments provide a circuit for reducing power in sending signals over two or more wires. The circuit includes the two or more wires. The circuit includes an encoder configured to receive two or more signals at a first end of the two or more wires and determine that the two or more signals should be encoded based at least on a previously received two or more signals. The encoder is further configured to encode the two or signals, and send the encoded two or more signals over the two or more wires.

Some embodiments provide an apparatus for reducing the power in sending signals over two or more wires. The apparatus is configured to receive two or more signals at a first end of the two or more wires. The apparatus is configured to determine that the two or more signals should be encoded based at least on a previously received two or more signals. The apparatus is configured to encode the two or more signals and send the encoded two or more signals over the two or more wires.

A computer readable non-transitory medium including instructions which when executed in a processing system cause the processing system to execute a method for reducing power in sending signals over two or more wires is disclosed.

BRIEF DESCRIPTION OF THE DRAWINGS

A more detailed understanding may be had from the following description, given by way of example in conjunction with the accompanying drawings wherein:

FIG. 6 illustrates how many capacitance recharging events occur with each of the line patterns, in accordance with some embodiments;

FIG. 7 illustrates a table that illustrates the case for two sending signals for which codes can be replaced with which codes, in accordance with some embodiments;

DETAILED DESCRIPTION OF EMBODIMENT(S)

Figure 1:
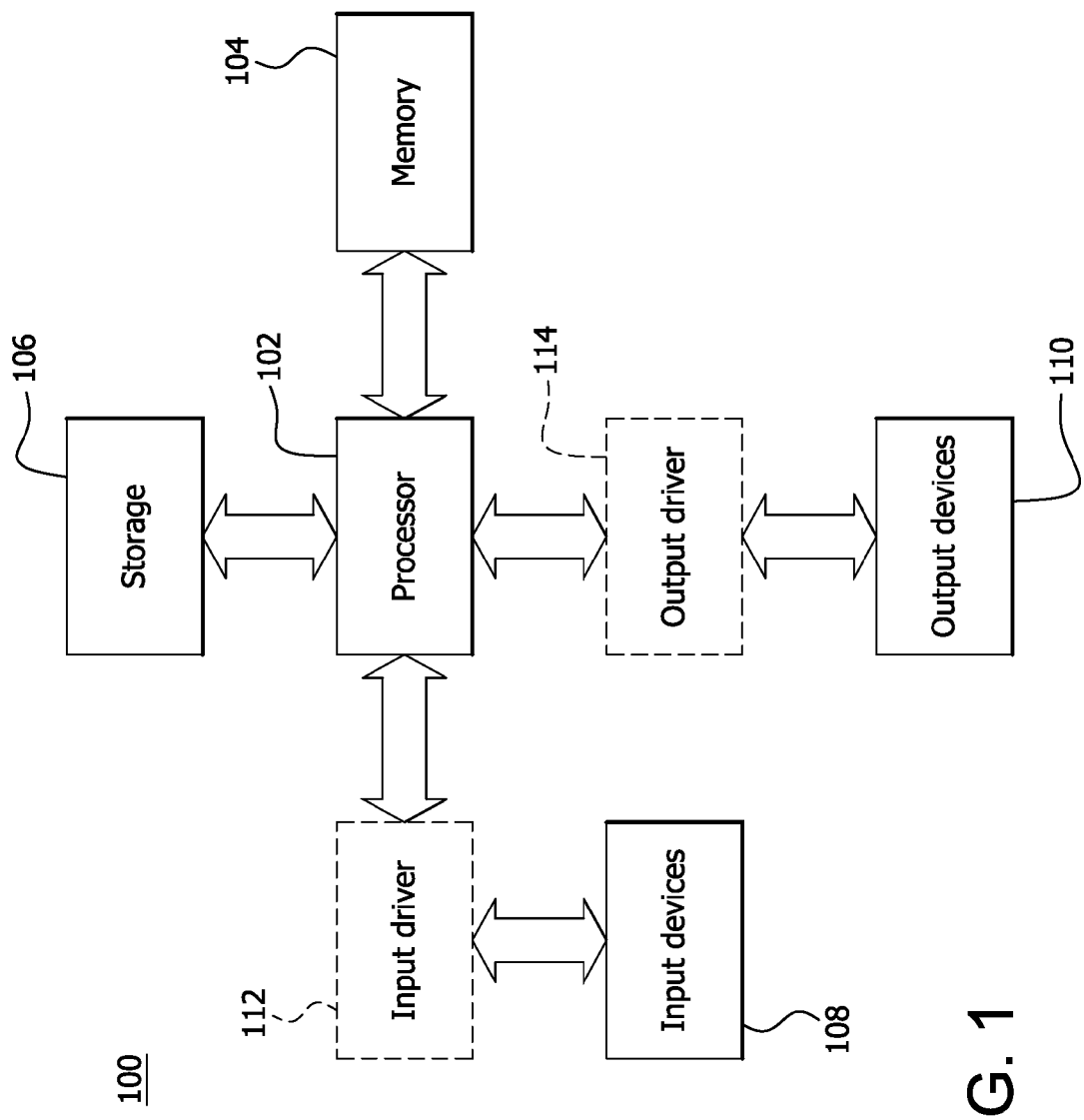
FIG. 1 is a block diagram of an example device in which one or more disclosed embodiments may be implemented.

FIG. 1 is a block diagram of an example device 100 in which one or more disclosed embodiments may be implemented. The device 100 may include, for example, a computer, a gaming device, a handheld device, a set-top box, a television, a mobile phone, or a tablet computer. The device 100 includes a processor 102, a memory 104, a storage 106, one or more input devices 108, and one or more output devices 110. The device 100 may also optionally include an input driver 112 and an output driver 114. It is understood that the device 100 may include additional components not shown in FIG. 1.

The processor 102 may include a central processing unit (CPU), a graphics processing unit (GPU), a CPU and GPU located on the same die, or one or more processor cores, wherein each processor core may be a CPU or a GPU. The GPU may include two or more SIMD processing units. The memory 104 may be located on the same die as the processor 102, or may be located separately from the processor 102. The memory 104 may include a volatile or non-volatile memory, for example, random access memory (RAM), dynamic RAM (DRAM), or a cache. The memory 104 may include one or more memory controllers. The memory controller may be located on the same die as the CPU or another die.

The storage 106 may include a fixed or removable storage, for example, a hard disk drive, a solid state drive, an optical disk, or a flash drive. The input devices 108 may include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 110 may include a display, a speaker, a printer, a haptic feedback device, one or more lights, an antenna, or a network connection (e.g., a wireless local area network card for transmission and/or reception of wireless IEEE 802 signals).

The input driver 112 communicates with the processor 102 and the input devices 108, and permits the processor 102 to receive input from the input devices 108. The output driver 114 communicates with the processor 102 and the output devices 110, and permits the processor 102 to send output to the output devices 110. It is noted that the input driver 112 and the output driver 114 are optional components, and that the device 100 will operate in the same manner if the input driver 112 and the output driver 114 are not present. Additionally, in some embodiments, there may be multiple dies with two or more wires connecting the multiple dies for communication. Each die may include a processor 102, memory 104, storage 106, input driver 112, and an output driver 114. The different processors 102 on the different die may form a processor array.

Figure 2:
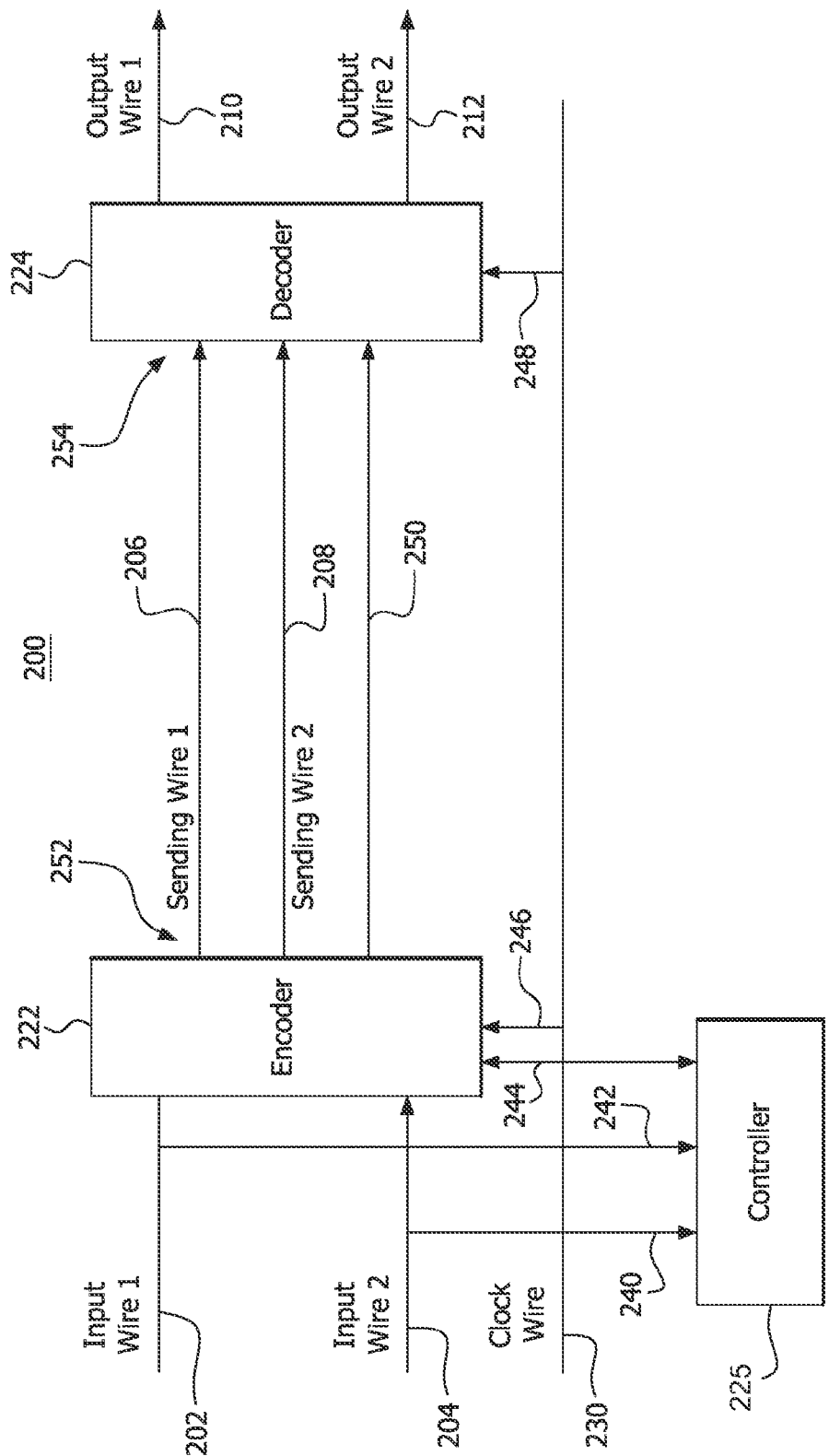
FIG. 2 is a schematic diagram illustrating an example of an apparatus for reducing power needed to send signals over wires, in accordance with some embodiments.

FIG. 2 is a schematic diagram illustrating an example of an apparatus for reducing power needed to send signals over wires. Illustrated in FIG. 2 is input wire 1 202, input wire 2 204, encoder 222, sending wire 1 206, sending wire 2 208, decoder 224, output wire 1 210, output wire 2 212, clock wire 230, and controller 225. The apparatus 200 takes an input signal 1 sent over input wire 1 202 and an input signal 2 sent over an input wire 2 204, and encodes input signal 1 and input signal 2 into encoded signal 1 sent over sending wire 1206, and encoded signal 2 sent over sending wire 2 208, and then decodes the encoded signal 1 and encoded signal 2 into output signal 1 sent over output wire 1 210 and output signal 2 sent over output wire 2 212, respectively.

Input wire 1 202 and input wire 2 204 may be wires to send input signal 1 (not illustrated) and input signal 2 (not illustrated), respectively. Encoder 222 may be an encoder 222 for encoding input signal 1 and input signal 2 to encoded signal 1 (not illustrated) and encoded signal 2 (not illustrated) which may lower the power needed to send input signal 1 and input signal 2 from a first end of the wires 252 to a second end of the two or more wires 254. Output wire 1 210 and output wire 2 212 may be wires to send encoded signal 1 and encoded signal 2 from the first end of the wires 252 to the second end of the wires 254.

The clock wire 230 may be a wire for sending a clock signal (not illustrated). In embodiments, the sending of the clock signal (not illustrated) over the clock wire 230 may divide the time into discrete intervals during which the values of the signals in the apparatus 200 can change their state or level. In embodiments, the clock signal may be transmitted together with signals on the input wires 202, 204 and the sending wires 206, 208 (source synchronous method), or the clock signal may be available from the encoder 222 and the decoder 224, and synchronized by the apparatus 200.

The controller 225 may be a circuit that is configured to determine a recoding for the encoder 222 to use to encode input signal 1 and input signal 2 into encoded signal 1 and encoded signal 2. The controller 225 may be a general purpose processor such as processor 102. The controller 225 may be electrically connected to input wire 1 and input wire 2 so that the controller 225 can sample the values of the input signal 1 and input signal 2 to determine an encoder mapping that may reduce the power needed to send the input signal 1 and input signal 2 over the encoded wire 1 and encoded wire 2, respectively. The controller 225 may be electrically connected to the encoder 222 so that the controller 225 can communicate the mapping for the encoder 222 to use.

The apparatus 200 may include wires 240, 242 for the controller 225 to sample or monitor input wire 1 202 and input wire 2 204, and then for the controller 225 to determine a recoding based on the monitoring of input wires 1 202 and input wire 2 204.

The apparatus 200 may include wire 250 to communicate the encoding mapping from the encoder 222 to the decoder 224. The decoder 224 may be configured to decode an encoded signal 1 on sending wire 1 206 and sending signal 2 on a encoded wire 2 208 into output signal 1 on output wire 1 210 and output signal 2 on output wire 2 212, respectively. Output signal 1 may have a same value as input signal 1 and output signal 2 may have a same as output signal 2.

The following are examples of a wire. A wire may be a metal connection inside an application specific integrated circuit (ASIC), or in an ASIC package, or on or in a silicon or glass interposer, or on or in a printed circuit board (PCB.)

The distance between the first end of the wires 252 and the second end of the wires 254 may be relatively long and may be considered an interconnect from one circuit to another circuit. In some embodiments, sending wire 1 206 and sending wire 2 208 may be wires that connect different dies with different processors 102 or other components of example device 100. In some embodiments, the different processors 102 may be part of a processor array.

In embodiments, the controller 225 and encoder 222 may not be separate. In embodiments, the apparatus may be configured with more than two input wires 202, 204. For example, there may be 8, 16, 1024, or more input wires.

In operation, the apparatus 200 encodes input signal 1 and input signal 2 which may lower the power needed to send input signal 1 and input signal 2 from the first end of the wires 252 to the second end of the wires 254.

Figure 3:
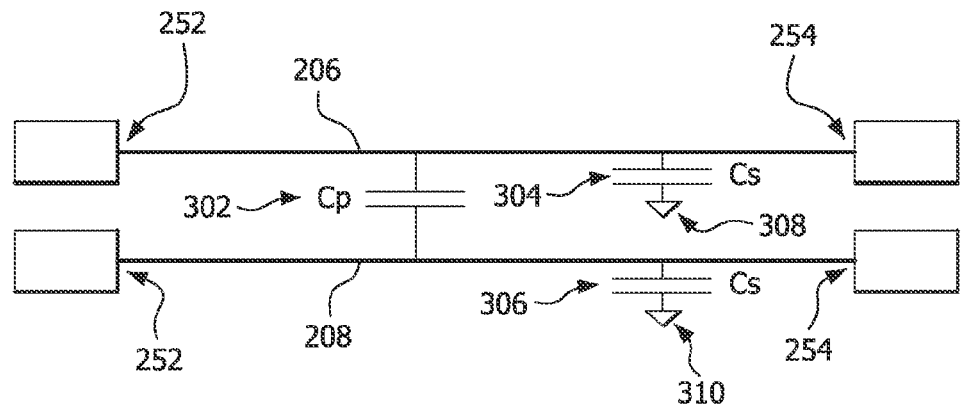
FIG. 3 schematically illustrates the capacitance in switching signals on the sending wires, in accordance with some embodiments.

FIG. 3 schematically illustrates the capacitance in switching signals on the sending wires. Some of the power consumed in sending signals over sending wire 1 206 and sending wire 2 208 is due to sending signal 1 and sending signal 2 switching to different values. The power consumed in switching sending signal 1 and in switching sending signal 2 is discussed with referenced to FIGS. 3 and 4.

Figure 4:
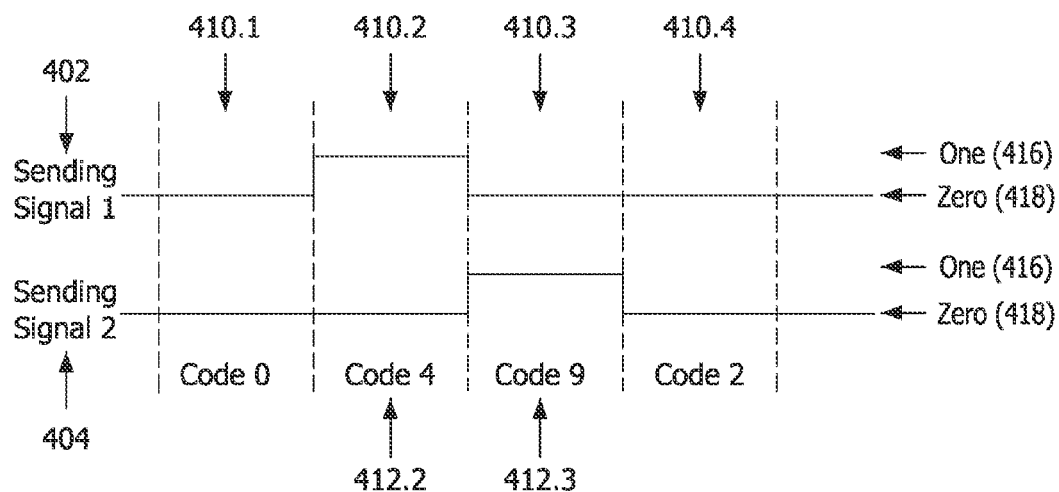
FIG. 4 schematically illustrates sending signal 1 and sending signal 2 switching values between a voltage level of 0 and a voltage level of 1, in accordance with some embodiments.

Illustrated in FIG. 3 is the first end of the wires 252 and the second end of the wires 254, sending wire 1 206, sending wire 2 208, capacitors $C_P$ 302, $C_S$ 304, and $C_S$ 306. FIG. 4 schematically illustrates sending signal 1 402 and sending signal 2 404 switching values between a voltage level of one 416 and a voltage level of zero 418. The sending signal value of 0 and sending signal value of 1 may be called logical value of 0 and logical value of 1, respectively.

$C_S$ 304 represents a capacitance between the sending signal 402 on sending wire 1 206 and the ground 308. When sending signal 1 402 on the sending wire 1 206 switches between zero (418) and one (416), which is illustrated at 410.2, or from one (416) to zero (418), which is illustrated at 410.3, the capacitance between the ground 308 and the sending signal 1 206 changes value, which requires power to recharge the capacitance.

Similarly, $C_S$ 306 represents a capacitance between sending signal 2 404 on sending wire 2 208 and the ground 310. When sending signal 2 404 on the sending wire 2 208 switches between zero (418) and one (416), which is illustrated 410.3, or from one (416) to zero (418), which is illustrated at 410.4, the capacitance between the ground 310 and the sending signal 2 208 changes value, which requires power to recharge the capacitance.

Additionally, $C_P$ 302 represents a capacitance between sending signal 1 402 and sending signal 2 404. When sending signal 1 402 and sending signal 2 404 switch value, then $C_P$ 302 will undergo a capacitor recharging event, which consumes power. An example of a switch in signals is 410.2 where sending signal 1 402 goes from zero (418) to one (416), while sending signal 404 remains at zero (418). In another example, at 410.3, sending signal 1 402 goes from one (416) to zero (418), and sending signal 2 404 goes from zero (418) to one (416), so the capacitance $C_P$ 302 may undergo a capacitor recharging event at approximately twice the previous example, because both sending signal 1 402 and sending signal 2 404 change value.

$C_S$ 304, 306 may be considered temporal capacitance recharging events because they represent a capacitance recharging due to the sending signals 402, 404 changing values themselves. $C_P$ 302 may be considered spatial changes because it represents capacitance recharging due a change with another sending wire 206, 208.

The power associated with switching sending signals 402, 404 depends on temporal changes of signals e.g. switching from low to high state, but also it depends on correlation between electrically adjacent transitions between signals or spatial changes. The $C_P$ 302 capacitance is high in densely routed chips, which decreases the switching speed and increases switching power.

Figure 5:
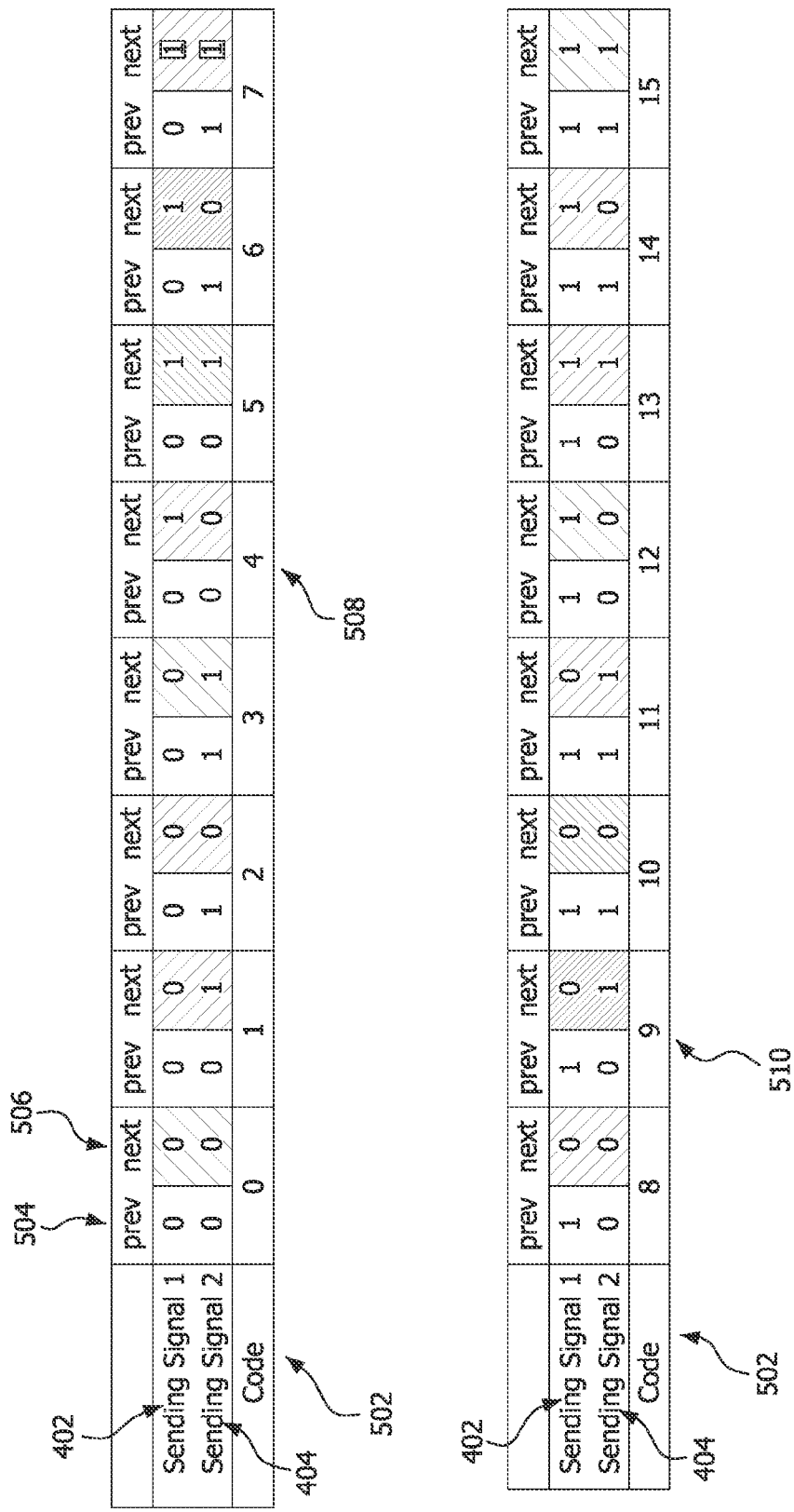
FIG. 5 illustrates all possible combinations of previous and current signal pairs, in accordance with some embodiments.

The controller 225 may be configured to classify the different switching possibilities for sending signals 402, 404. FIG. 5 illustrates all possible combination pairs of previous and current signal pairs. Note that the case of only two signals is disclosed, which yields 16 possible combinations, but that this is easily extended to more than two signals. For three signals, the combination would be a combination triple, and the word tuple can be used for the different number of combination of signals. Illustrated in FIG. 5, is each of the 16 different possible combinations of sending signals 402, 404 from a previous 504 to a next 506, with each combination given a code 502. For example, code 4 508 is when sending signal 1 402 and sending signal 2 404 are zero (418) in the previous 504, and then switch to sending signal 1 402 being one (416), and sending signal 2 402 remaining zero 418. This situation is represented in the table of FIG. 5 as code 4 508, and in FIG. 4 as code 4 412.2.

Additionally, the controller 225 may be configured to determine how much to weight the different capacitance recharging events. In the example that follows each of the capacitance recharging events for $C_S$ 304, 306 may be considered a 1 and a capacitance change for $C_P$ 302 may be considered either a 1 for a single signal switching value, or 2 if both signals switch value as in code 9 412.3.

The controller 225 may classify each of the different codes 502 into how many capacitance recharging events occur. FIG. 6 illustrates how many capacitance recharging events occur with each of the line patterns. For example, line pattern 1 604, has 0 $C_P$ recharging events and 0 $C_S$ recharging events. Line pattern 2 606 has 1 $C_P$ recharging events and 1 $C_S$ recharging events. Line pattern 3 608 has 2 Cp recharging events and 0 $C_S$ recharging events. And, Line pattern 4 610 has 2 Cp recharging events and 2 $C_S$ recharging events. The controller 225 may then be able to determine a relative amount of power each of the codes 502 requires. The power determination may depend on one or more factors. For example, the power determination may depend on the topology of the wires, the type of wires used, and the voltages used. In some embodiments, the power determination may be determined based on the relative number of capacitance recharging events.

The controller 225 may be configured to create a recoding or mapping from one code 502 to another code 502 so that less power is consumed in switching the signals.

FIG. 7 illustrates a table 700 that illustrates the case for two sending signals 402, 404 for which codes 502 can be replaced with which codes 702. For the case for code 4 508, the table illustrates that code 4 508 could be replaced with a replacement codes 0, 1, or 5, 704. This is so as the previous code 504 for the replacement code 704 needs to be the same as for code 4 508. For code 4 508 the previous code 504 is 0 for sending signal 1 402, and 0 for sending signal 2 404, and codes 0, 1, and 5, all have a 0 for sending signal 1 402, and 0 for sending signal 2 404.

In a similar fashion, the column for replacement codes 702 can be determined by the controller 225, or could be predetermined.

The controller 225 may be configured to monitor or sample the values of input signal 1 and input signal 2, and use these samples to determine a mapping from the current codes 502 to different codes 502 that may reduce the power needed to send the input signals 402, 404 from the first end of the wires 252 to the second end of the wires 254. Similarly, the controller 225 may sample the sending signals 402, 404. The mapping may assign codes 502 that require a high capacitance power such as code 9 412.3 (and 510), which is line pattern 4 610, which requires a power of 4, to a code 502 that requires a lower power.

Figures 8, 9:
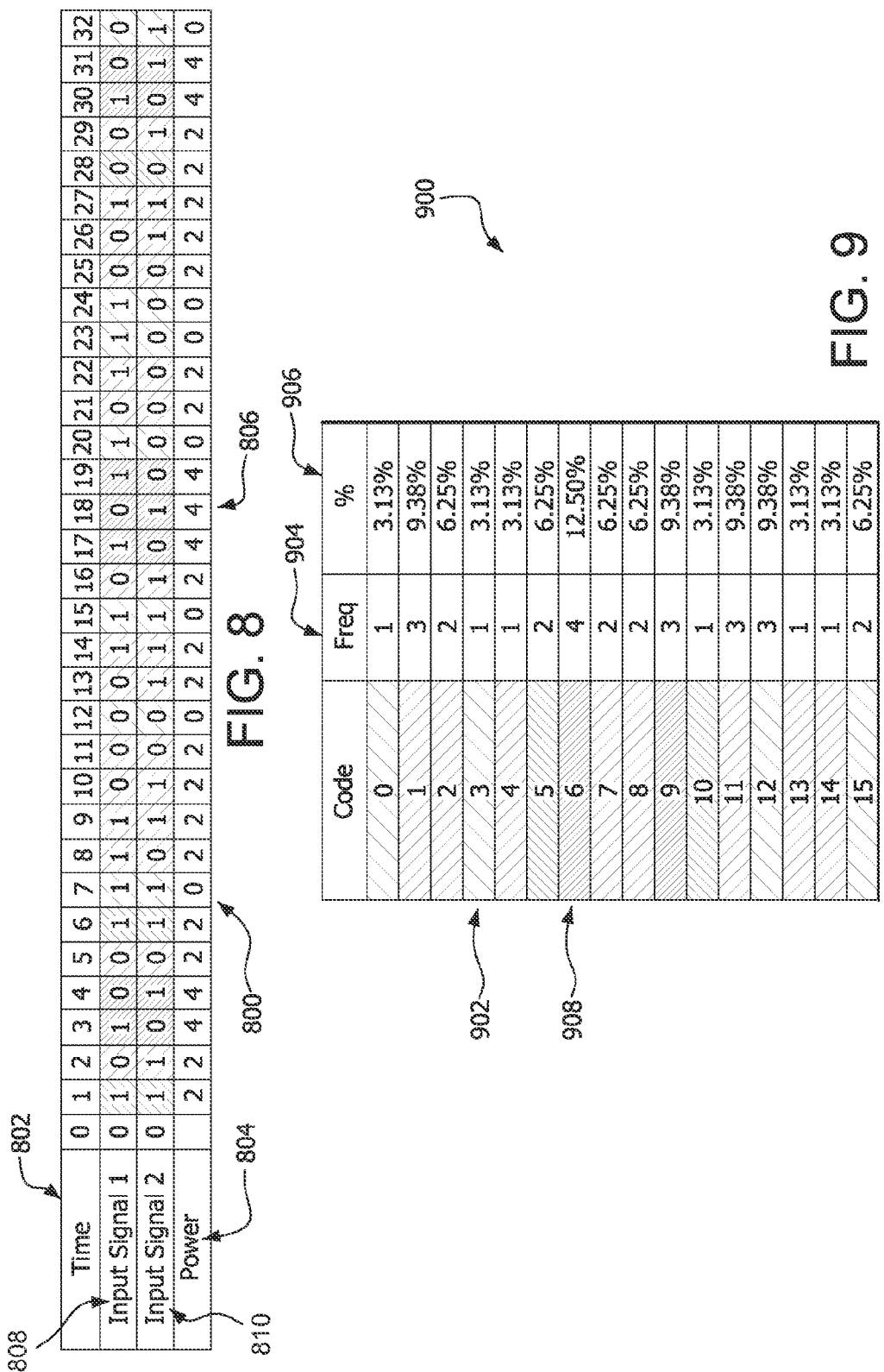
FIG. 8 illustrates a table of samples taken by the controller of input signal 1 and input signal 2, in accordance with some embodiments.
FIG. 9 illustrates a table of the frequencies of the different codes of table, in accordance with some embodiments.

FIG. 8 illustrates a table 800 of samples taken by the controller 225 of input signal 1 808 and input signal 2 810. The samples were taken over 32 time units 802 which may be related to clock cycles as the controller monitored input signal 1 and input signal 2. The estimated power used in switching signals is estimated at 804. The codes are not identified in table 800, but they are easily identified. For example, 806 is code 9, since the input signals 808, 810, switch from (1, 0) to (0, 1.)

FIG. 9 illustrates a table 900 of the frequencies of occurrences of the different codes 502 of table 800. For example, code 3 902 has a frequency of 1, which is 3.13% of the samples. And, code 6 908 has a frequency of 4, which is 12.5% of the samples. The controller 225 may determine that the average power is 2 for table 900. The controller 225 may be configured to analyze the information in table 900 to determine a recoding or mapping that will lower the power needed. For example, the controller 225 may determine that code 6 908 may be replaced by code 3 902. See FIG. 7 which illustrates that code 6 may be replaced with code 2, 3, or 7.

Figure 10:
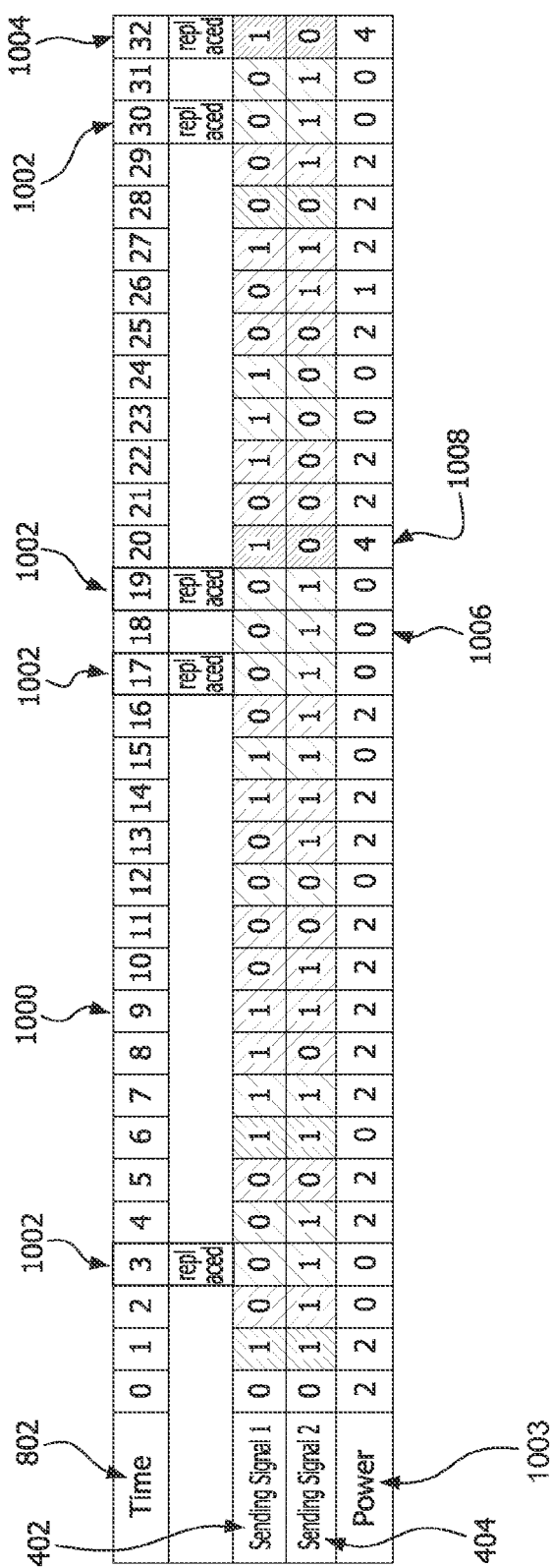
FIG. 10 illustrates a table where code 6 has been exchanged with code 3, in accordance with some embodiments.

FIG. 10 illustrates a table 1000 where code 6 has been exchanged with code 3. Code 6 is replaced with code 3 at 1002, where there are 4 places. And, code 3 is replaced with code 6 at 1004. Table 1000 illustrates how the input signals of table 900 may be encoded by encoder 222, and the resulting power 1003 that may be used by the capacitance, which may be represented by $C_P$ and $C_S$, in sending the sending signals 402, 404. The average power used in table 1000 is 1.34 which is a 33% reduction from the power used in table 900. Changing all code 6's for code 3's may change other codes. For example, at 1006 the code is changed from a code 9 (power of 4) to a code 3 which is a power of 0. Another example is at 1008, where a code 12, power of 0, is changed to a code 6, which is a power of 4. So, the recoding or mapping may increase some power usage and decrease other power usage.

Figure 11:
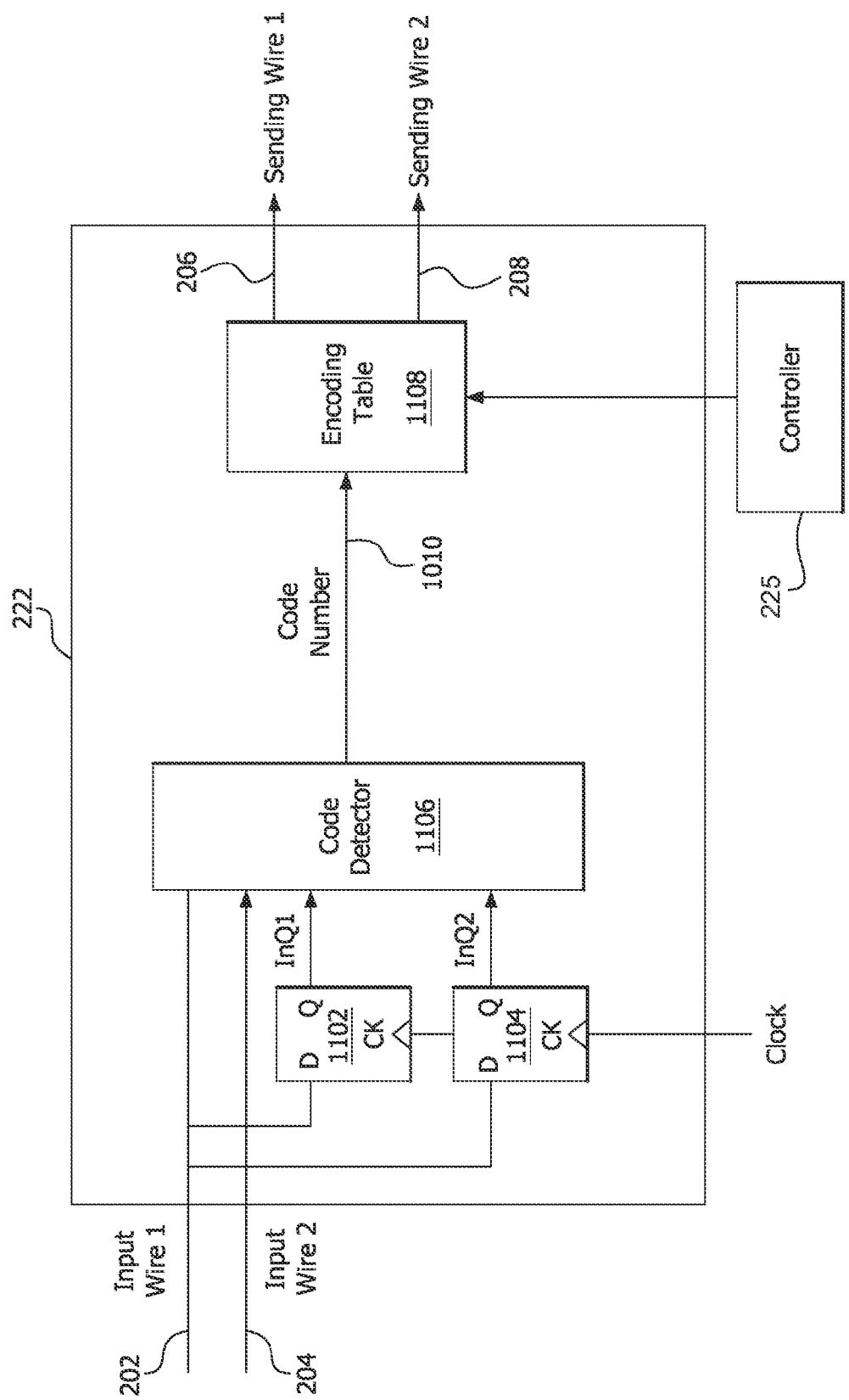
FIG. 11 schematically illustrates an example of the encoder, in accordance with some embodiments.

FIG. 11 schematically illustrates an example of the encoder 222. Illustrated in FIG. 11 is input wire 1 202, input wire 2 204, flip-flops 1102, 1104, code detector 1106, encoding table 1108, controller 225, sending wire 1 206, and sending wire 2 208.

The encoder 222 receives two input signals over input wire 1 202, and input wire 2, respectively, and every clock cycle it either passes the input signals through unmodified or modifies the input signals. The encoder 222 may have an encoding table 1108 that it uses to determine whether or not to modify the input signals. The mapping or encoding table 1108 has 16 entries for the case of two input signals. The encoding table 1108 may be organized as follows:

Recoding Table 1108

| Input code number | output binary signals over sending wire 1 and 2 | Notes |
|---|---|---|
| 0 | 00 | |
| 1 | 01 | |
| 2 | 00 | |
| 3 | 10 | Re-coded to code-6 |
| 4 | 10 | |
| 5 | 11 | |
| 6 | 01 | Re-coded to code-3 |
| 7 | 11 | |
| 8 | 00 | |
| 9 | 01 | |
| 10 | 00 | |
| 11 | 01 | |
| 12 | 10 | |
| 13 | 11 | |
| 14 | 10 | |
| 15 | 11 | |

The encoding table 1108 continues with the previous example with code 6 and code 3 exchanged with one another. The controller 225 may write and rewrite the encoding table 1108. The code detector 1106 translates the current input signals as well as the previous values of those signals into the code number 1010. The registers or flip-flops 1102, 1104 remember the previous state of the signals. In embodiments, the code detector 1106 is a combinatorial logic circuit configured to perform functions that can be described as the following "truth table":

Truth Table

| Input Signal 1 [1 bit] | Input Signal 2 [1 bit] | Input Signal 1 (delayed 1 clock) [1 bit] | Input Signal 2 (delayed 1 clock) [1 bit] | Code Number [4 bits] |
|---|---|---|---|---|
| 0 | 0 | 0 | 0 | 0 |
| 0 | 1 | 0 | 0 | 1 |
| 0 | 0 | 0 | 1 | 2 |
| 0 | 1 | 0 | 1 | 3 |
| 0 | 0 | 1 | 0 | 4 |
| ... | ... | ... | ... | ... |
| 1 | 1 | 1 | 1 | 15 |

In embodiments, a decoder 224 may operate in a similar fashion.

Figure 12:
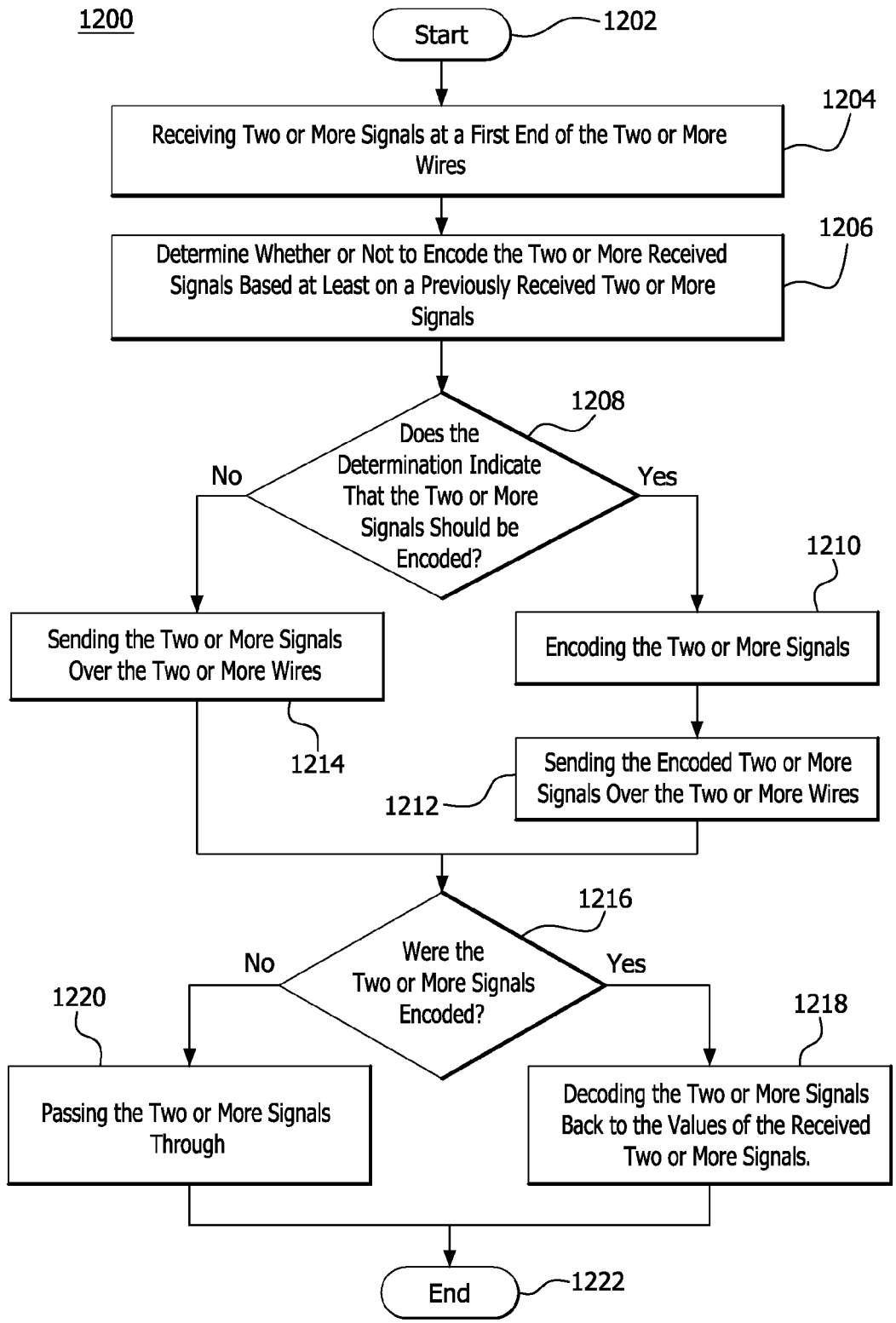
FIG. 12 illustrates an example of a method for reducing power in sending signals over two or more wires, in accordance with some embodiments.

FIG. 12 illustrates an example of a method 1200 for reducing power in sending signals over two or more wires. The method 1200 may start with 1202.

The method 1200 may continue with receiving two or more signals at a first end of the two or more wires 1204. For example, in FIG. 2 the input signals are received over input wires 202, 204. The method 1200 may continue with determining whether or not to encode the two or more received signals based at least on a previously received two or more signals 1206. For example, the controller 225 may determine encoding table 1108. The encoder 222 may then use the determined encoding table 1108 to determine whether or not to encode input signal 1, and input signal 2.

The method 1200 may continue with determining whether the determination indicated that the two or more signals should be encoded 1208. For example, in FIG. 11, the encoding table 1108 is used to determine whether or not to encode input signal 1, and input signal 2. The method 1200 may continue with encoding the two or more signals 1210, when the determination indicates that the two or more signals should be encoded. FIG. 2 illustrates an example of an encoder 222 that may encode the input signals, if the encoding table 1108 indicates that the input signals should be encoded. The method 1200 may continue with sending the encoded two or more signals over the two or more wires 1212. For example, in FIG. 2, the encoder 222 may send encoded signals over the sending wire 1 206 and sending wire 2 208.

Alternatively, if the determination indicates that the two or more signals should not be encoded, then the method 1200 continues with sending the two or more signals over the two or more wires 1214. For example, in FIG. 2, the encoder 222 may send the encoded input signals (sending signals 402, 404) over the sending wire 1 206 and sending wire 2 208.

The method 1200 may continue with determining whether the two or more signals encoded 1216. If the two or more signals were encoded, then the method 1200 continues with decoding the two or more signals back to the values of the received two or more signals 1218. For example, in FIG. 2, the decoder 224 may decode the encoded signals on sending wires 206, 208. Alternatively, if the two or more signals were not encoded, then the method 1200 continues with passing the two or more signals through 1220. For example, in FIG. 2, the decoder 224 may determine that the signals received on the sending wires 206, 208 do not need to be decoded, so the signals may be passed through to the output wires 210, 212. The method 1200 may then end 1222.

Figure 13:
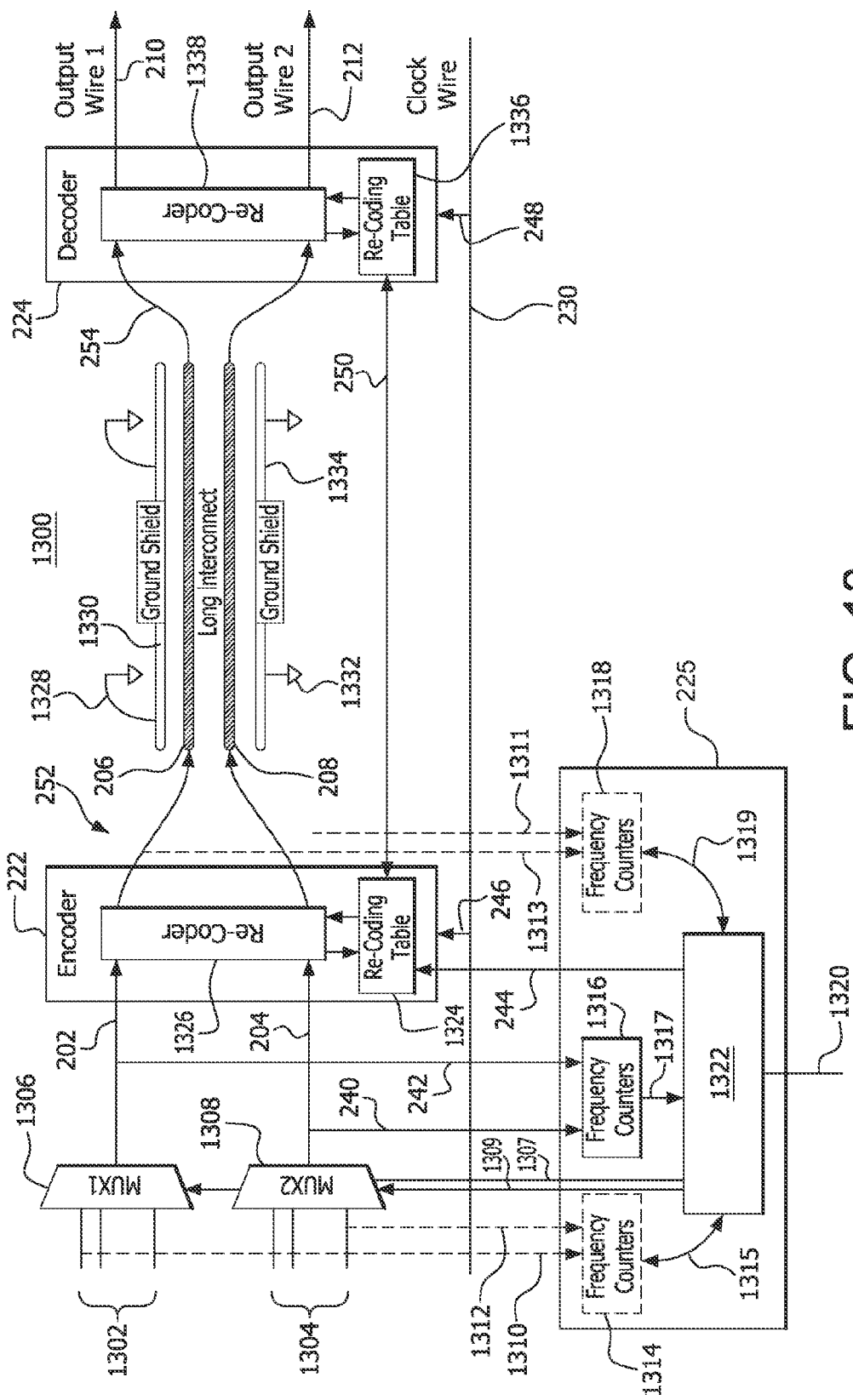
FIG. 13 is a schematic diagram illustrating an example of an apparatus for reducing power needed to send signals over wires, in accordance with some embodiments.

FIG. 13 is a schematic diagram illustrating an example of an apparatus 1300 for reducing power needed to send signals over wires, in accordance with some embodiments. Illustrated in FIG. 13 are the following elements that are similar to those elements illustrated in FIG. 2: an input wire 1 202, input wire 2 204, encoder 222, sending wire 1 206, sending wire 2 208, decoder 224, output wire 1 210, output wire 2 212, clock wire 230, and controller 225. The apparatus 1300 takes an input signal 1 sent over input wire 1 202 and an input signal 2 sent over an input wire 2 204, and encodes input signal 1 and input signal 2 into encoded (or sending) signal 1 sent over sending wire 1 206, and encoded (or sending) signal 2 sent over sending wire 2 208, and then decodes the encoded signal 1 and encoded signal 2 into output signal 1 sent over output wire 1 210 and output signal 2 sent over output wire 2 212, respectively.

Additionally, illustrated in FIG. 13 are input wires 1302, 1304, multiplexer 1 1306, multiplexer 2 1308, multiplexer control lines 1307, 1309, input sample wires 1310, 1312, frequency counters 1314, 1316, 1318, frequency counter communication wires 1315, 1317, 1319, inter communication wire 1320, recoder controller 1322, sending sample wires 1311, 1313, ground wires 1328, 1332, ground shields 1330, 1334, re-coders 1326, 1338, re-coding tables 1324, 1336.

Input wires 1302, 1304 may be wires to send input signals (not illustrated). There may be many input wires 1302, 1304 that may be a communication bus. The input wires 1302, 1304 not selected to be recoded may be sent over other wires (not illustrated.) Multiplexer 1 1306 and multiplexer 2 1308 may be multiplexers that enable the controller 225 to select input wires 1302, 1304 to be the input wire 202 and input wire 204. Multiplexer control lines 1307, 1309 may be control lines for the controller 225 to control multiplexer_1 1306, and multiplexer 2 1308, respectively. Frequency counter 1314 may be a frequency counter that counts the frequency of combination pairs of one or more of the signals sent over the input wires 1302, 1304.

Frequency counter 1316 may be a frequency counter to count the frequency of combination pairs of signals sent over input wire 202 and input wire 204.

Re-coder 1326 may be an encoder. Re-coding table 1324 may be an encoding table. Re-coder 1338 may be an encoder. Re-coding table 1336 may be an encoding table.

Sending sample wires 1311, 1313 may be wires that the controller 225 can use to monitor the signals on the sending wires 206, 208, respectively. Frequency counters 1318 may be frequency counters to count the frequency of combination pairs of signals sent over sending wire 1 206, and sending wire 2 208.

Recoder controller 1322 may be a controller configured to determine a recoding. Frequency counter communication wire 1315 may be one or more wires for the recoder controller 1322 to communicate with the frequency counters 1314. Frequency counter communication wire 1317 may be one or more wires for the recoder controller 1322 to communicate with the frequency counters 1316. Frequency counter communication wire 1319 may be one or more wires for the recoder controller 1322 to communicate with the frequency counters 1318.

Inter communication wire 1320 may be one or more wires for the controller 225 to communicate with components regarding determining the recoding.

The sending wires 206, 208 may be shielded with ground shields 1330, 1334, which may be attached to ground wires 1328, 1332, respectively. The ground shields 1330, 1334 may provide the advantage that the energy used to switch the signals on the sending wires 206, 208, may be independent of adjacent signals due to the ground shields 1330, 1334, being at ground voltage.

The encoder 222 may include a re-coder 1326 and a re-coding table 1324. The re-coding table 1324 is a recoding from one combination pair to a pair of signals to encode the pair of received input signals. The re-coder 1326 may be implemented in software, hardware, firmware, or microinstructions. The re-coder 1326 may use the re-coding table 1324 to determine the encoding of the input signals 225, over the input wires 202, 204. The encoder 222 may receive the re-coding table 1324 from the controller 225. The encoder 222 may communicate the re-coding table 1324 to the decoder 224. The encoder 222 may communicate the encoding of the input signals to the decoder 224.

The decoder 224 may include a re-coder 1338 and a re-coding table 1336. The re-coding table 1336 may be a recoding from one combination pair to a pair of signals to decode the received encoded signal 1 sent over sending wire 1 206, and to decode encoded signal 2 sent over sending wire 2 208. The re-coder 1338 may be implemented in software, hardware, firmware, or microinstructions. The re-coder 1338 may use the re-coding table 1336 to determine the decoding of received encoded signal 1 sent over sending wire 1 206, and the decoding encoded signal 2 sent over sending wire 2 208. The decoder 224 may receive the re-coding table 1336 from the controller 225. The decoder 222 may communicate the re-coding table 1336 to the encoder 222.

In operation, the apparatus 200 may include the multiplexer 1 1306, and multiplexer 2 1308, which enable the controller 225 to select which input wires 1302, 1304, to be the input wires 202, 204 for recoding. In this way, only some of the input wires 1302, 1304 may be encoded. The controller 225 may be configured to monitor input wires 1302, 1304, using the input sample wires 1310, 1312. The controller 225 may determine which input wires 1302, 1304, to select as the input wires 202, 204, based on which input signals sent over input wires 1302, 1304, may be recoded to lower the power needed to send the input signals over input wires 1302, 1304. The controller 225 may be configured to determine the relative amount of power that may be saved by selecting different input wires 1302, 1304, according to disclosed embodiments for determining the power needed to send signals over wires. For example, the controller 225 may keep frequency counters of the different combination tuples of the input signals sent over the input wires 1302, 1304, and determine a power saving for the different input signals sent over the input wires 1302, 1304 that may be expected by recoding the input signals. The controller 225 may then select the input wires 1302, 1304 to encode by controlling multiplexer 1 1306 and multiplexer 2 1308 using multiplexer control line 1307, and multiplexer control line 1309, respectively.

The controller 225 may include frequency counters 1314, 1316, and 1318. Frequency counter 1314 may maintain a frequency of combination pairs of signals sent over input wires 1302, 1304. Frequency counter 1316 may maintain a frequency of combination pairs of signals sent over input line 1 202 and input line 2 204. Frequency counter 1318 may maintain a frequency of combination pairs of signals sent over sending line 1 206 and sending line 2 208. The controller 225 may also include recoder controller 1322 and inter communication wire 1320. The controller 225 may use frequency counters 1314 to determine a combination pair frequency count of signals sent over different input wires 1302, 1304. The controller 225 may be configured to determine which input wires 1302, 1304 to select as input wire 1 202 and input wire 2 204 based on analyzing the combination pair frequencies and determine a number of capacitor rechargings due to signals switching for the different input wires 1302, 1304.

In some embodiments, the controller 225 may receive signals over inter communication wire 1320 that indicate which input wires 1302, 1304 to encode. The controller 225 may be configured to monitor input signal 1, and input signal 2, using wires 240, 242, then the controller 225 may analyze the monitored signals. For example, the controller 225 may keep track of a frequency of combination pairs using frequency counter 1316. The controller 225 may determine to select a new pair of signals sent over input wires 1302, 1304 based on the analysis.

The recoder controller 1322 may be the portion of the controller 225 that determines a recoding. The portion of the controller 225 that determines a recoding for the encoder 222 may be implemented in software, hardware, firmware, or microinstructions. The portion of the controller 225 that determines a recoding for the encoder 222 may be located in a different place other than on the controller 225. For example, the recoder controller 1322 may be software located in a memory of a CPU. The portion of the controller 225 that determines a recoding may be located over wire 1320. The controller 225 may communicate information regarding input signal 1 and input signal 2, input signals over input wires 1302, 1304, or signals sent over sending wires 206, 208. As examples, the controller 225 may receive over inter communication wire 1320 a recoding, an indication of whether or not to recode the signals, or an indication of which of the signals on input wires 1302, 1304 to encode.

The controller 225 may be configured to monitor or sample the signals sent over the sending wires 206, 208, using sending sample wires 1313, 1311 and determine a new recoding to encode the input signals, to lower the power needed to send the sending signals 402, 404 from the first end of the wires 252 to the second end of the wires 254. In embodiments, if the recoding does not reduce the switching power, then different input wires 202, 204 may be selected to encode. In embodiments, if the recoding does not reduce the power required to send the signals over sending wires 206, 208, as much as expected within a threshold, then the controller 225 will determine a new recoding, or select new signals sent over input wires 1302, 1304 to recode.

In embodiments, the controller 225 may be configured to maintain a frequency table that maintains the frequency of each of the codes 502 for the selected input signals, to determine the frequency of occurrence of all codes. The count entries may be 32 bits each and, in embodiments, percentages may be calculated at every clock cycle. In embodiments, every time one of the counter is about to overflow, all the counters are restarted from zero.

In embodiments, the encoding of the input signals may be predetermined. In embodiments, the encoding of the signals may be predetermined for different applications and the recoding selected based on the application sending signals over the sending wires 206, 208.

The embodiments disclosed are for two signals on two wires. However, it is apparent how to extend the disclosed embodiments to include more than two signals on more than two wires. For example, the combination pairs would be combination tuples. For the case of three wires there would be 8×8 or 64 combination triples.

In some embodiments, the wire 250 to communicate the encoding mapping from the encoder 222 to the decoder 224 may be called a side band channel (SBC). In embodiments, there may not be a separate wire 250 for the SBC, but rather the SBC may communicate the encoding mapping from the encoder 222 to the decoder 224 over the sending wires 206, 208.

In some embodiments, the output of the encoder 222, sending wires 206, 208, may be connected to another code frequency determiner or calculator such as another controller 225, which would count occurrences of all codes 502 being transmitted, and determine percentages of occurrences of all signal codes 502 and if the current encoding does not reduce the switching power, then the another recoding may be determined or the original recoding may be used.

Examples of the disclosed embodiments have the advantage that in applications such as an application specific integrated circuit, long buses/interconnects that consume a lot of power because of the switching signals, which causes recharging of capacitances associated with wires, may consume less power by encoding the signals before sending the signals over the long buses/interconnects and then decoding the signals after sending the signals over the long buses/interconnects.

It should be understood that many variations are possible based on the disclosure herein. Although features and elements are described above in particular combinations, each feature or element may be used alone without the other features and elements or in various combinations with or without other features and elements.

Some embodiments of the methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be maskworks that are then used in a semiconductor manufacturing process to manufacture a processor which implements aspects of the disclosed embodiments.

The methods or flow charts provided herein may be implemented in a computer program, software, or firmware incorporated in a computer-readable storage medium for execution by a general purpose computer or a processor. In some embodiments, the computer-readable storage medium is non-transitory computer readable storage medium. Examples of computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A method of reducing power in sending signals over two or more wires, the method comprising:
receiving two or more signals;
monitoring two or more previously received signals over two or more clock cycles;
determining a recoding based on performing an analysis of the monitored two or more previously received signals over the two or more clock cycles;
determining that the two or more signals should be encoded based at least on the recoding;
encoding the two or more signals; and
sending the encoded two or more signals over the two or more wires.

2. The method of claim 1, wherein the determining that the two or more signals should be encoded based at least on the recoding comprises: comparing the received two or more signals and the two or more previously received signals with the recoding to determine if the recoding indicates that the two or more signals should be encoded.

3. The method of claim 1, wherein the determining that the two or more signals should be encoded based on the recoding comprises: comparing the received two or more signals and the two or more previously received signals stored in two flip-flops with the recoding to determine if the recoding indicates that the two or more signals should be encoded.

4. The method of claim 1, wherein the performing the analysis further comprises:
analyzing the monitored two or more previously received signals over two or more clock cycles to determine at least one combination tuple of the two or more previously received signals and the received two or more signals that can be recoded to a different combination tuple to lower a frequency of occurrence of the determined at least one combination tuple sent over the two or more wires, wherein the different combination tuple requires less power than the at least one combination tuple.

5. The method of claim 4, wherein the at least one combination tuple is a combination pair.

6. The method of claim 4, wherein the analysis further comprises performing a statistical analysis of the frequency of the at least one combination tuple.

7. The method of claim 4, wherein performing the analysis further comprises:
analyzing the monitored two or more previously received signals over two or more clock cycles to determine a frequency of each of the at least one combination tuple of the two or more previously received signals and the received two or more signals, wherein the determining the recoding further comprises:
determining the recoding that substitutes the at least one combination tuple of the two or more previously received signals and the received two or more signals for other combination tuples of the two or more previously received signals and the received two or more signals, wherein based on the determined frequency of each of the at least one combination tuple and a number of capacitor recharging of each combination tuple, a number of expected capacitor recharging is lowered.

8. The method of claim 1, wherein the recoding lowers a number of switches between signal values of two or more previously sent signals and the received and encoded two or more signals.

9. The method of claim 1, further comprising:
maintaining a frequency count table of combination tuples of the two or more encoded and sent signals, and determining a new recoding based on the frequency count table to reduce the power needed to send the encoded two or more signals from a first end of the two or more wires to a second end of the two or more wires.

10. The method of claim 1, further comprising:
a controller monitoring the received two or more signals over two or more clock cycles, and generating a new recoding based on performing an analysis of the monitored received two or more signals over two or more clock cycles that indicates that the new recoding would lower a number of switches between signal values of the two or more previously received signals and the received two or more signals compared with the recoding.

11. The method of claim 1, further comprising:
sending an indication that the two or more signals are encoded to a decoder.

12. The method of claim 1, wherein the encoding changes one or more logic zero value signals to logic one value signals and one or more one logic value signals to logic zero value signals.

13. The method of claim 1, further comprising:
maintaining a frequency count table of combination tuples of the two or more previously received signals and the received two or more signals, and determining a recoding based on the frequency count table to reduce the power needed to send the two or more signals from a first end of the two or more wires to a second end of the two or more wires; and
determining whether the received two or more signals should be encoded based at least on the recoding.

14. The method of claim 1, further comprising:
receiving the sent two or more signals at a second end of the two or more wires; and
if the sent two or more signals were encoded, then decoding the sent two or more signals back to the values of the received two or more signals.

15. A circuit for reducing power in sending signals over two or more wires, the circuit comprising:
the two or more wires; and
an encoder configured to:
receive two or more signals,
monitor two or more previously received signals over two or more clock cycles,
determine a recoding based on performing an analysis of the monitored two or more previously received signals over the two or more clock cycles,
determine to encode the two or more signals based at least on the recoding,
encode the two or more signals, and
send the encoded two or more signals over the two or more wires.

16. The circuit of claim 15, further comprising:
a decoder configured to:
receive the sent two or more signals at an end of the two or more wires that is opposite an end of the two or more wires that is connected to the encoder, and
if the sent two or more signals were encoded, then decode the sent two or more signals back to the values of the received two or more signals.

17. The circuit of claim 15, wherein the performing the analysis further comprises:
performing the analysis by analyzing the monitored two or more previously received signals over two or more clock cycles to determine at least one combination tuple of the two or more previously received signals and the received two or more signals that can be recoded to a different combination tuple to lower a frequency of occurrence of the determined at least one combination tuple sent over the two or more wires, wherein the different combination tuple requires less power than the at least one combination tuple.

18. The circuit of claim 15, wherein the controller is further configured to:
maintain a frequency count table of combination tuples of the two or more previously received signals and the received two or more signals, and determine the recoding based on the frequency count table to reduce the power needed to send the encoded two or more signals from a first end of the two or more wires to a second end of the two or more wires.

19. An apparatus for reducing the power in sending signals over two or more wires, the apparatus having a processor configured to:
receive two or more signals;
monitor two or more previously received signals over two or more clock cycles;
determine a recoding based on performing an analysis of the monitored two or more previously received signals over the two or more clock cycles;
determine that the two or more signals should be encoded based at least on the recoding;
encode the two or more signals; and
send the encoded two or more signals over the two or more wires.

* * * * *